United States Patent
Aono et al.

(10) Patent No.: US 11,967,187 B2
(45) Date of Patent: Apr. 23, 2024

(54) VEHICLE INSPECTION SYSTEM

(71) Applicant: HONDA MOTOR CO., LTD., Tokyo (JP)

(72) Inventors: Kento Aono, Tochigi-ken (JP); Takeshi Katamine, Tochigi-ken (JP)

(73) Assignee: HONDA MOTOR CO., LTD., Tokyo (JP)

( * ) Notice: Subject to any disclaimer, the term of this patent is extended or adjusted under 35 U.S.C. 154(b) by 510 days.

(21) Appl. No.: 17/276,830

(22) PCT Filed: Sep. 4, 2019

(86) PCT No.: PCT/JP2019/034811
§ 371 (c)(1),
(2) Date: Mar. 17, 2021

(87) PCT Pub. No.: WO2020/059496
PCT Pub. Date: Mar. 26, 2020

(65) Prior Publication Data
US 2021/0272391 A1  Sep. 2, 2021

(30) Foreign Application Priority Data

Sep. 21, 2018 (JP) ................. 2018-177984

(51) Int. Cl.
*G07C 5/08* (2006.01)
*G01S 13/86* (2006.01)
(Continued)

(52) U.S. Cl.
CPC .......... *G07C 5/0808* (2013.01); *G01S 13/865* (2013.01); *G01S 13/931* (2013.01); *G06F 30/15* (2020.01); *G06V 10/60* (2022.01); *G06V 10/98* (2022.01); *G06V 20/58* (2022.01); *G06V 20/588* (2022.01); *G07C 5/02* (2013.01)

(58) Field of Classification Search
None
See application file for complete search history.

(56) References Cited

U.S. PATENT DOCUMENTS

| 2017/0017847 A1 | 1/2017 | Nakaya |
| 2020/0074024 A1* | 3/2020 | Levinson ............. G05D 1/0088 |

FOREIGN PATENT DOCUMENTS

| JP | 3558272 | 8/2004 |
| JP | 2008-215912 | 9/2008 |
| JP | 2015-200586 | 11/2015 |

OTHER PUBLICATIONS

International Search Report and Written Opinion for International Application No. PCT/JP2019/034811 dated Oct. 29, 2019, 5 pages.

* cited by examiner

*Primary Examiner* — Whitney Moore
(74) *Attorney, Agent, or Firm* — Amin, Turocy & Watson, LLP

(57) ABSTRACT

This vehicle inspection system comprises: a monitor that displays a simulated image captured by a camera and imitating external environment information; a target device that returns an irradiation wave from an electromagnetic sensor as a reflected wave; a simulator device that changes the external environment information by changing the simulated image or the reflected wave; and an inspection device that inspects actuators of a vehicle to be inspected on the basis of the changed external environment information.

3 Claims, 11 Drawing Sheets

(51) Int. Cl.
    *G01S 13/931*    (2020.01)
    *G06F 30/15*     (2020.01)
    *G06V 10/60*     (2022.01)
    *G06V 10/98*     (2022.01)
    *G06V 20/56*     (2022.01)
    *G06V 20/58*     (2022.01)
    *G07C 5/02*      (2006.01)

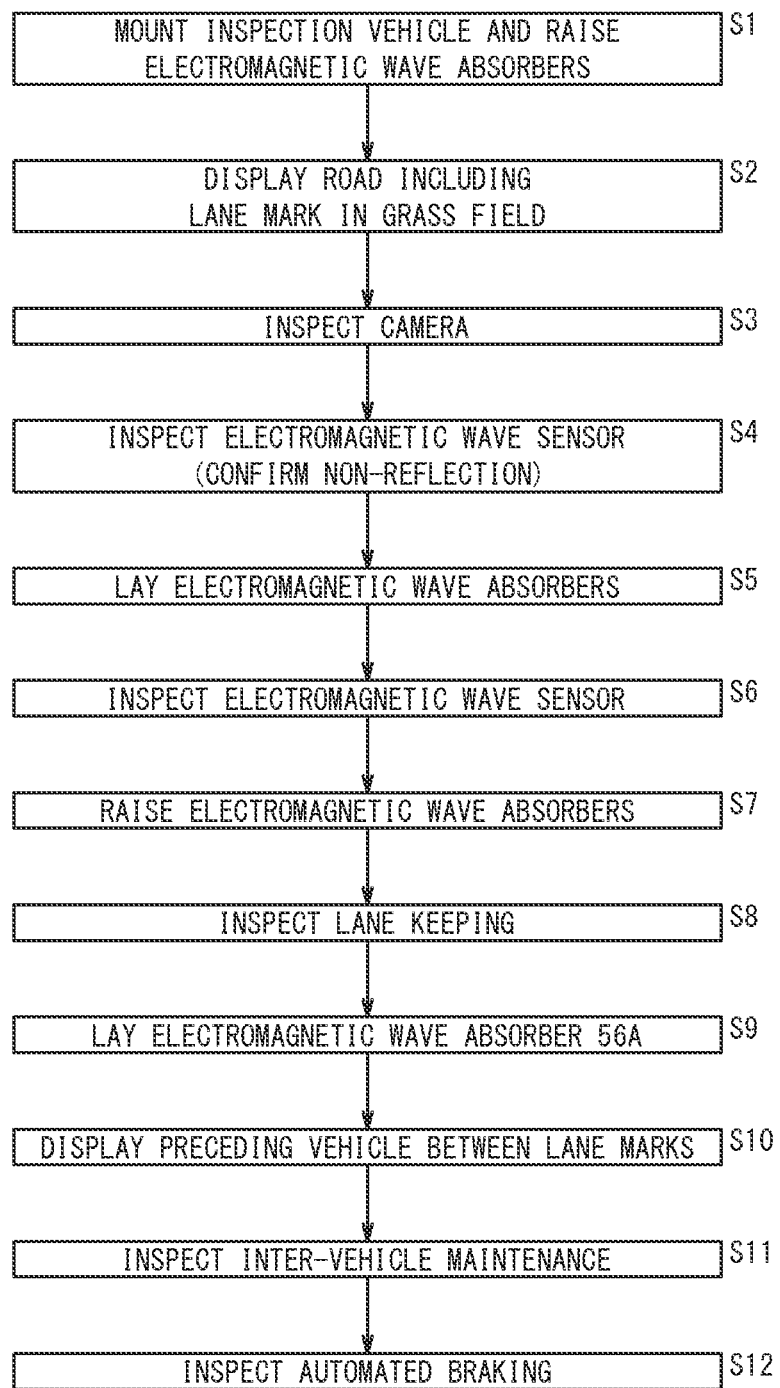

VEHICLE INSPECTION SYSTEM

TECHNICAL FIELD

The present invention relates to a vehicle inspection system that inspects, on a bench test machine, an inspection vehicle including an electromagnetic wave sensor that emits an electromagnetic wave and detects external environment information by a reflection wave, a camera that detects an external environment by an image, and a control device that operates an actuator regarding steering, driving, or braking on the basis of both the detected external environment information.

BACKGROUND ART

For example, Japanese Patent No. 3558272 (hereinafter, referred to as JPB3558272) discloses a technique relating to an inspection method for an inter-vehicle distance control device mounted on a vehicle. This inter-vehicle distance control device includes a bench test device on which the vehicle is mounted in a travel state, a blocking means disposed in a non-detectable area by a radar and at such a position that the blocking means blocks, in front of the bench test device, a beam from the radar, and a reflection means which is farther than the blocking means and disposed in a detectable area by the beam from the radar.

In this technique, the vehicle is mounted on the bench test device, the inter-vehicle distance control device is operated in a state where the beam from the radar is blocked and where the vehicle is set to an adaptive cruise travel possible speed, and then the blocking state is canceled to thereby cause the beam to reach the reflection means, so that the existence of a preceding vehicle is perceived and operation of an automated deceleration function is started. In addition, the reflection means is moved in a direction approaching the vehicle, so that a state where the vehicle suddenly approaches the preceding vehicle occurs and operation of an automated brake function is started.

SUMMARY OF INVENTION

In the technique described in JPB3558272, operation of the inter-vehicle distance control device mounted on the vehicle can be checked directly in a state that is similar to an actual travelling state, and thus, a comprehensive inspection as a completed vehicle can be improved.

Incidentally, in an advanced driver assistance system (ADAS) or an automated driving system in recent years, it is monitored whether the vehicle is traveling at the center between lane marks (lane), by using a camera, in addition to an electromagnetic wave sensor such as a radar.

However, in the technique described in JPB3558272, there are cases where the output of the inter-vehicle distance control mounted on the vehicle on the basis of an image obtained from the radar beam in an external environment where the radar beam is blocked does not coincide with an external environment by an image photographed by the camera.

The present invention has been made in view of the problem as above, and an object of the present invention is to provide a vehicle inspection system in which the inconsistency between external environment information detected by an electromagnetic wave sensor and external environment information detected by a camera is resolved, and operation of an actuator regarding steering, driving, or braking of an inspection vehicle including the electromagnetic wave sensor and the camera can be inspected.

One aspect of the present invention is a vehicle inspection system configured to inspect, on a bench test machine, an inspection vehicle including an electromagnetic wave sensor configured to emit an electromagnetic wave and detect external environment information by a reflection wave, a camera configured to detect external environment information by an image, and a vehicle control device configured to operate an actuator regarding steering, driving, or braking on the basis of both the detected external environment information, and the vehicle inspection system includes: a monitor configured to display a simulation image simulating the external environment information by the image, the simulation image being photographed by the camera; a target device configured to return the reflection wave upon incidence of an emitted wave from the electromagnetic wave sensor; a simulator device configured to change the external environment information by changing at least one of the simulation image to be displayed on the monitor and the reflection wave to be returned from the target device; and an inspection device configured to inspect operation of the actuator of the inspection vehicle on the basis of the changed external environment information.

The vehicle inspection system according to the present invention includes: the monitor configured to display the simulation image simulating the external environment information by the image, photographed by the camera; the target device configured to return the reflection wave upon the incidence of the emitted wave from the electromagnetic wave sensor; the simulator device configured to change the external environment information by changing at least one of the simulation image to be displayed on the monitor and the reflection wave to be returned from the target device; and the inspection device configured to inspect the operation of the actuator of the inspection vehicle on the basis of the changed external environment information.

Therefore, the inconsistency between the external environment information detected by the electromagnetic wave sensor and the external environment information detected by the camera is resolved, and the operation of the actuator regarding the steering, the driving, or the braking of the inspection vehicle including the electromagnetic wave sensor and the camera can be inspected.

BRIEF DESCRIPTION OF DRAWINGS

FIG. 8 is a flowchart used for describing operation of the vehicle inspection system;

FIG. 10B is a schematic rear view in which FIG. 10A is viewed from the left.

DESCRIPTION OF EMBODIMENT

A preferred embodiment of a vehicle inspection system according to the present invention is hereinafter described in detail with reference to the attached drawings.

[Configuration]

Figure 1:
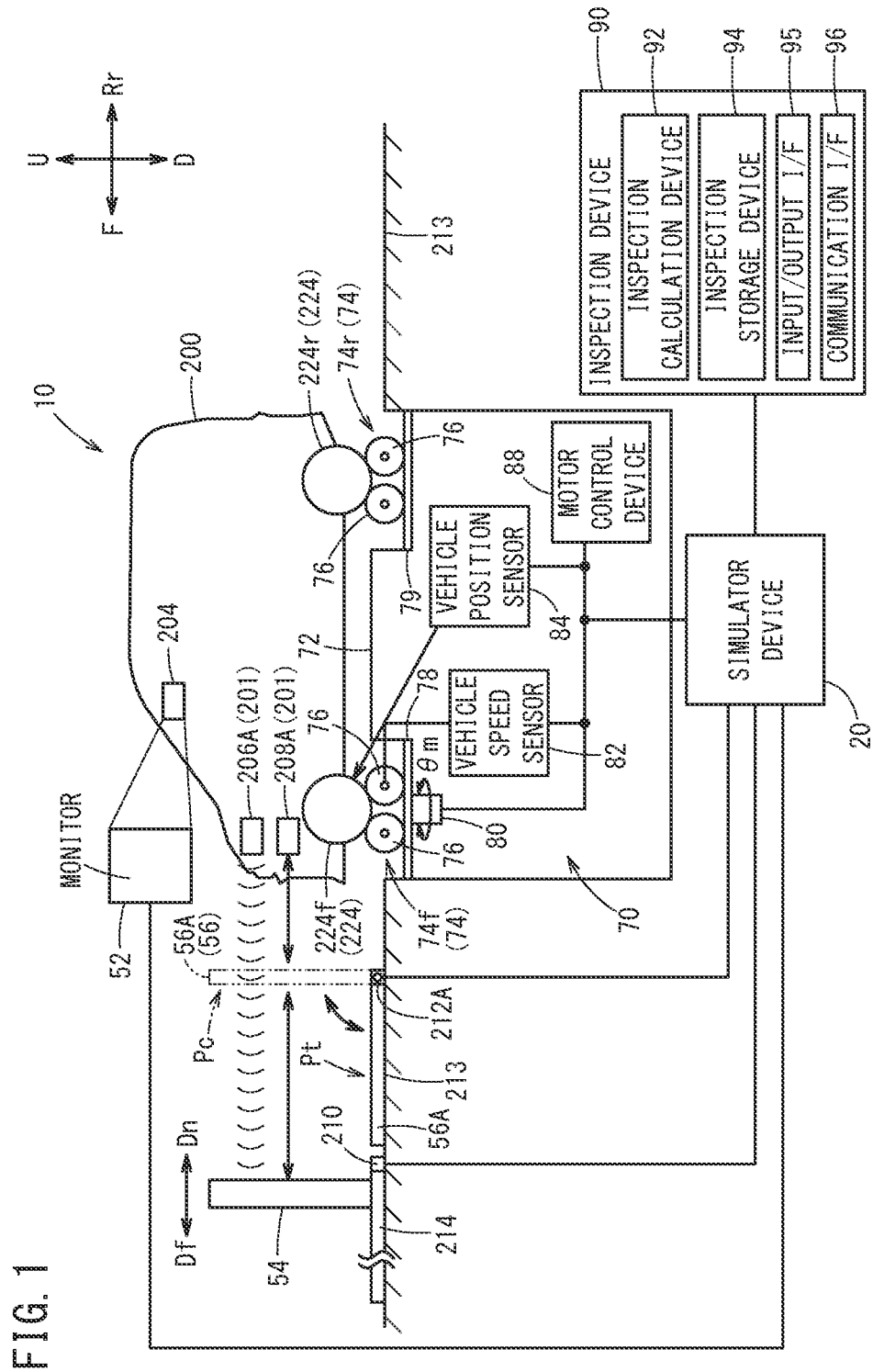
FIG. 1 is a schematic structure diagram of a vehicle inspection system according to an embodiment.

FIG. 1 is a schematic structure diagram of a vehicle inspection system 10 according to the embodiment.

Figure 2:
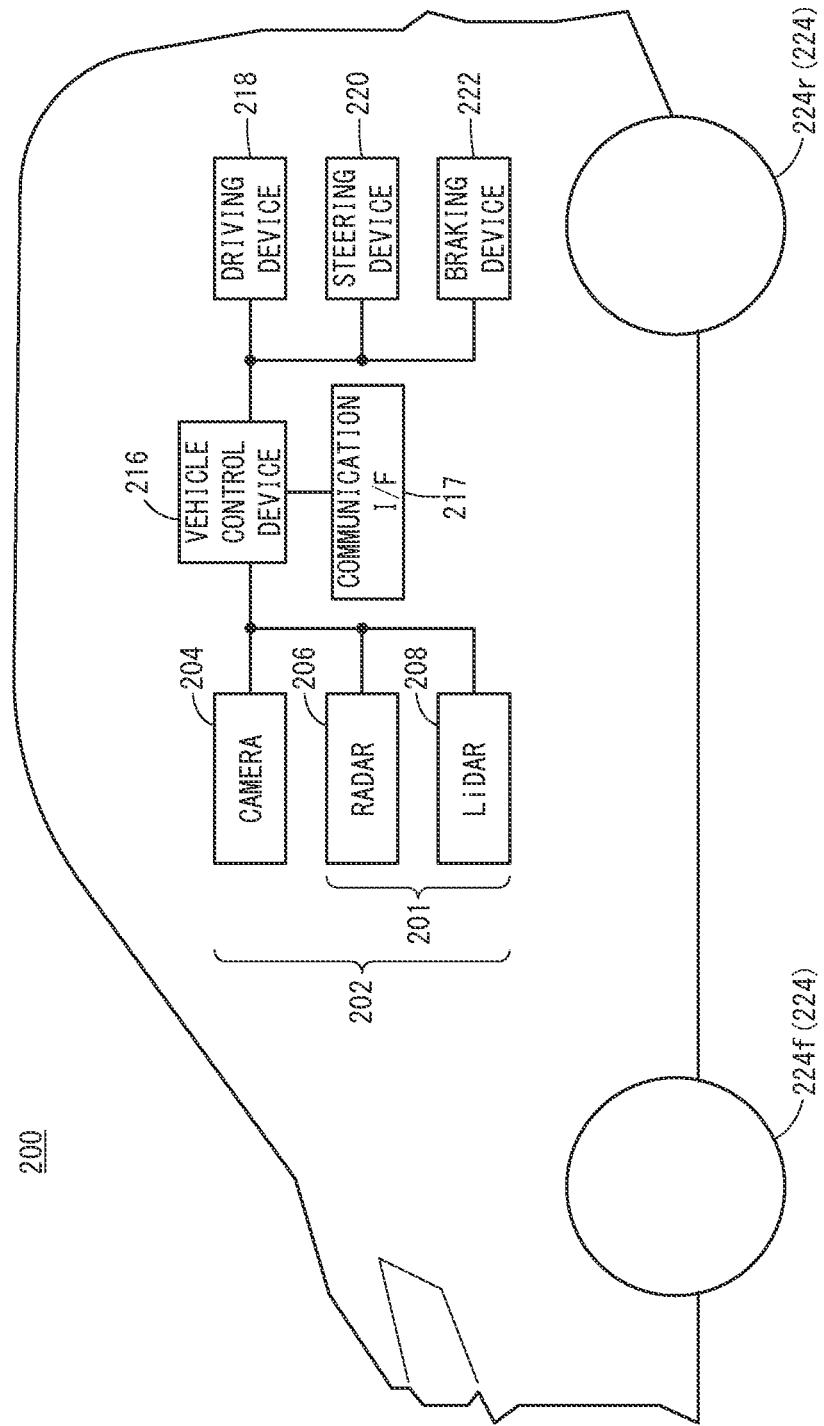
FIG. 2 is a schematic structure diagram of an inspection vehicle that is inspected by the vehicle inspection system.

FIG. 2 is a schematic structure diagram of a vehicle (inspection vehicle) 200 that is inspected by the vehicle inspection system 10.

It is assumed that the vehicle 200 to be inspected is an automated driving vehicle (including fully automated driving vehicle) capable of automatic control of steering, acceleration/deceleration driving, and braking; however, the vehicle 200 may alternatively be a driving assistance vehicle capable of automatic control of at least one of the steering, the acceleration/deceleration driving, and the braking.

As illustrated in FIG. 2, the vehicle 200 includes a plurality of external environment sensors 202, a vehicle control device 216 that performs travel control on the basis of external environment information detected by the external environment sensors 202, a driving device 218 and a steering device 220 that operate in accordance with an operation instruction output from the vehicle control device 216, a braking device 222, and wheels 224.

Moreover, a communication interface (I/F) 217 is connected to the vehicle control device 216. The communication I/F 217 supplies the external environment information or the like detected by the external environment sensors 202 or the like to an inspection device 90 (see FIG. 1) through a communication I/F 96 of the inspection device 90 and to a simulator device 20 through the inspection device 90.

Note that the inspection device 90 is a device that is installed on an inspection floor 213, but may be a mobile terminal such as a smartphone, which is portable, includes a display unit with a touch sensor and a keyboard, and can perform wireless communication.

Back to FIG. 2, the external environment sensors 202 include one or more cameras 204, one or more radars 206, and one or more LiDARs 208.

The radar 206 transmits and receives an electric wave within a predetermined irradiation range (predetermined emission angle) in a horizontal direction and a vertical direction with an electric wave axis being centered. The LiDAR 208 transmits and receives laser light within a predetermined irradiation range (predetermined emission angle) in the horizontal direction and the vertical direction with an optical axis being centered.

As it is commonly known, the wavelength of the electric wave of the radar 206 is several centimeters, for example, and the wavelength of the laser light of the LiDAR 208 is several micrometers. Since the wavelength ranges thereof are different from each other, the radar 206 and the LiDAR 208 form an electromagnetic wave sensor 201 with the different wavelength ranges.

In FIG. 1 and FIG. 2, to make it easier to understand, the vehicle 200 includes each one of the aforementioned external environment sensors 202. However, as described below, the vehicle 200 according to the present embodiment includes one camera 204, six radars 206, and six LiDARs 208.

Figure 3:
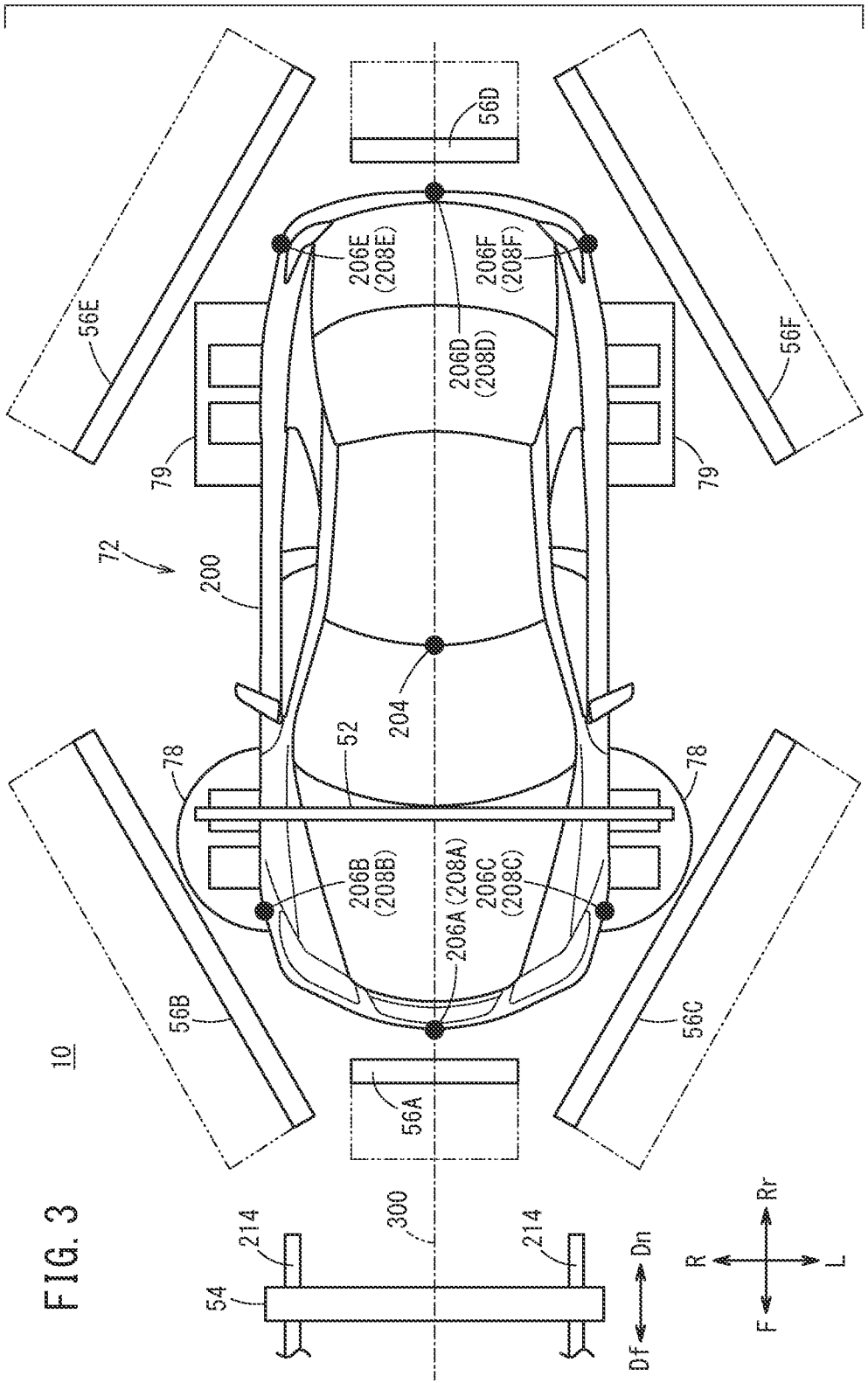
FIG. 3 is a partially omitted plan view of the vehicle inspection system in which the inspection vehicle is mounted on a bench test machine.

FIG. 3 is a partially omitted plan view of the vehicle inspection system 10 in which the vehicle 200 is mounted on a bench test machine 72.

Figure 4:
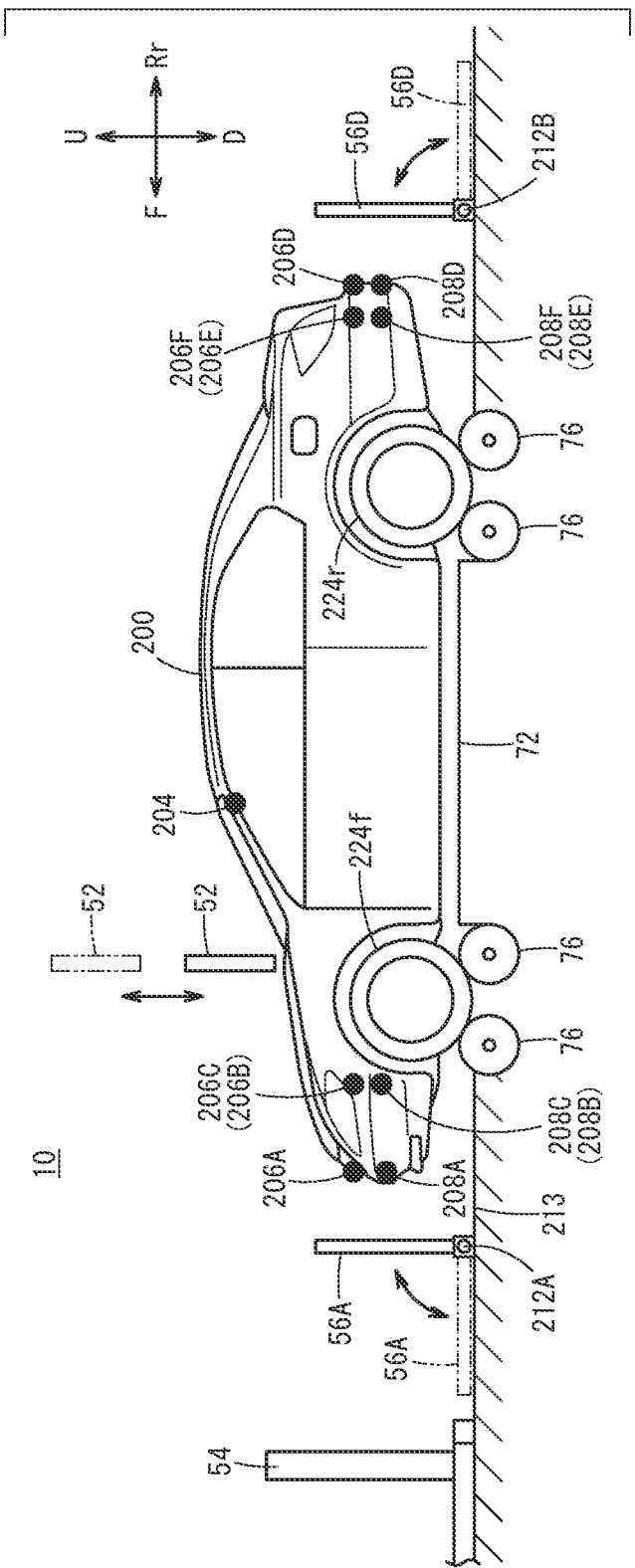
FIG. 4 is a partially omitted side view of the vehicle inspection system in which the inspection vehicle is mounted on the bench test machine.

FIG. 4 is a partially omitted side view of the vehicle inspection system 10 in which the vehicle 200 is mounted on the bench test machine 72.

Note that in FIG. 1, FIG. 3, and FIG. 4, and FIG. 6 and FIG. 7 to be described below, arrows crossing each other, which are illustrated near the vehicle 200, indicate a front direction F, a rear direction Rr, a right direction R, and a left direction L of the vehicle 200 in the plan view. The arrows indicate the front direction F, the rear direction Rr, an up direction U, and a down direction D of the vehicle 200 in the side view.

As illustrated in FIG. 1, the camera 204 captures an image in front of the vehicle 200 at a predetermined view angle (angle of view, range of vision) in the horizontal direction and the vertical direction. As illustrated in FIG. 3 and FIG. 4, this camera 204 is provided near a rearview mirror positioned at the center of a front windshield of the vehicle 200, and the optical axis of the camera 204 is oriented to the front of the vehicle 200.

As illustrated in FIG. 3, two radars 206 (radar 206A, radar 206D) are provided on a front part and a rear part on a center line (vehicle center line) 300 of the vehicle 200 in the width direction R, L so that the electric wave axes are oriented to the front direction F and the rear direction Rr, respectively. Moreover, four radars 206 are provided on a right-front part (radar 206B), a left-front part (radar 206C), a right-rear part (radar 206E), and a left-rear part (radar 206F) of the vehicle 200 so that the electric wave axes are oriented to a right-front direction, a left-front direction, a right-rear direction, and a left-rear direction, respectively. In total, the six radars (radars 206A to 206F) are provided.

On the other hand, the LiDARs 208 are provided respectively on the same positions as the six radars 206 in the plan view, that is, the LiDARs 208 are positioned below (down direction D) the respective radars 206A to 206F. In total, the six LiDARs (LiDARs 208A to 208F) are provided.

Each LiDAR 208 is provided so that the direction of the optical axis thereof is substantially the same as the direction of the electric wave axis of the corresponding radar 206. More specifically, the optical axis of each LiDAR 208 is oriented in substantially the same direction as (approximately parallel direction to) the electric wave axis of each radar 206 provided at the same position as the LiDAR 208 in the plan view (FIG. 3) and provided above the LiDAR 208 in a front view, the side view (FIG. 4), and a rear view.

Back to FIG. 2, the vehicle control device 216 is connected to the external environment sensors 202 and transmits and receives data (signal) or the like to and from the external environment sensors 202. The vehicle control device 216 is formed by a vehicle control ECU. The vehicle control ECU calculates the acceleration/deceleration, the steering angle, and the braking amount that are optimal in each situation (scene) on the basis of the external environment information detected by the external environment sensors 202, and outputs the operation instruction to the driving device 218, the steering device 220, and the braking device 222 each corresponding to a control target device.

The driving device 218, which can be controlled by the vehicle control device 216, includes a driving ECU, and a driving source such as an engine or a driving motor. The driving device 218 generates a driving force for the wheels 224 in accordance with the occupant's operation on an accelerator pedal (in the inspection vehicle 200, the occupant is a driver operator who is sitting on a driver's seat) or an acceleration/deceleration instruction output from the vehicle control device 216.

The steering device 220, which can be controlled by the vehicle control device 216, includes an electric power steering system (EPS) ECU and an EPS actuator. The steering device 220 changes the steering angle of the wheels 224 (front wheels) in accordance with the occupant's operation of a steering wheel (in the inspection vehicle 200, the occupant is the driver operator who is sitting on the driver's seat) or the operation instruction output from the vehicle control device 216.

The braking device 222, which can be controlled by the vehicle control device 216, includes a brake ECU and a brake actuator. The braking device 222 generates the braking force for the wheels 224 in accordance with the occupant's operation on a brake pedal (in the inspection vehicle 200, the occupant is the driver operator who is sitting on the driver's seat) or a braking instruction output from the vehicle control device 216.

As illustrated in FIG. 1, the vehicle inspection system 10 that inspects the operation of the vehicle 200 includes the simulator device 20, a monitor 52 (display device), a target device (object) 54, an electromagnetic wave absorber 56A, an operation detection device 70, and the inspection device 90.

Figure 5:
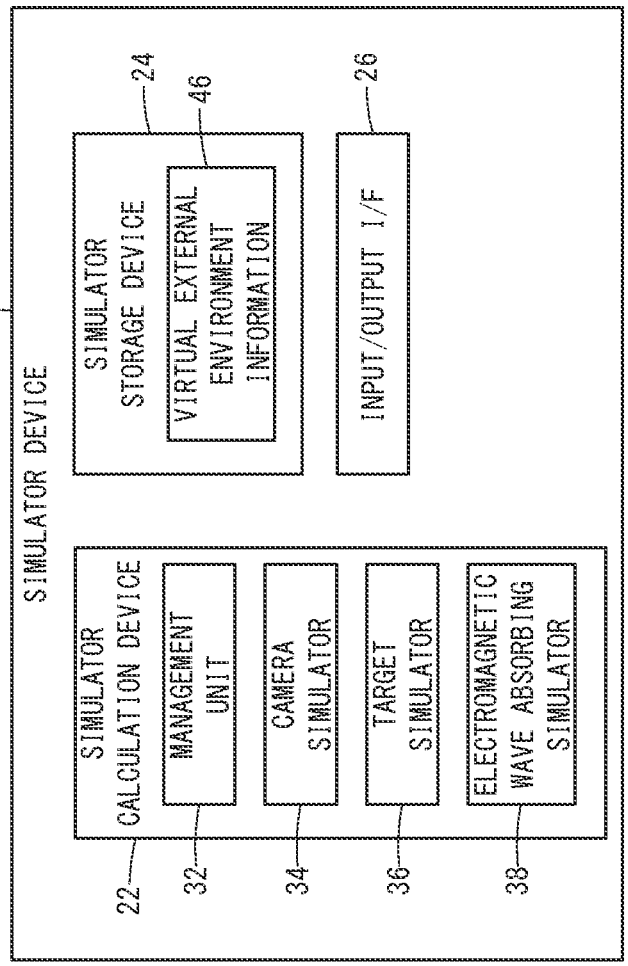
FIG. 5 is a structure diagram illustrating a function block of a simulator device.

FIG. 5 is a structure diagram illustrating a function block of the simulator device 20. As illustrated in FIG. 5, the simulator device 20 is formed by a computer, and includes a simulator calculation device 22, a simulator storage device 24, and an input/output I/F 26. The input/output I/F 26 includes an input I/F and an output I/F, and can be used for both wireless communication and wired communication.

The simulator calculation device 22 is formed by a processor such as a CPU. The simulator calculation device 22 achieves various functions by executing programs stored in the simulator storage device 24. Here, the simulator calculation device 22 functions as a management unit 32, a camera simulator 34, a target simulator (object simulation device) 36, and an electromagnetic wave absorbing (electromagnetic wave blocking) simulator 38.

The management unit 32 has a function of managing a process of inspecting the vehicle 200. For example, on the basis of virtual external environment information 46 stored in the simulator storage device 24, the management unit 32 reproduces a virtual external environment with the camera simulator 34. That is to say, the management unit 32 has a function of cooperatively controlling the camera simulator 34, the target simulator 36, and the electromagnetic wave absorbing simulator 38 such that the camera simulator 34 synchronously reproduces the virtual information corresponding to the same virtual external environment.

When the virtual external environment is reproduced, the management unit 32 calculates a virtual travel position of the vehicle 200 in the virtual external environment on the basis of the operation information (vehicle speed V and steering angle θs) of the vehicle 200 output from the operation detection device 70.

The camera simulator 34 has a function of reproducing video information detected by the camera 204 at the virtual travel position of the vehicle 200. The camera simulator 34 outputs the video information as the virtual information to the monitor 52.

The target simulator 36 has a function of reproducing positional information of the target device 54 (object) (including target devices 231 to 235 (see FIG. 6) to be described below) that is detected by the radar 206 and the LiDAR 208 at the virtual travel position of the vehicle 200.

The target simulator 36 moves, along a rail 214, the target device 54 that is disposed ahead of the inspection vehicle 200 on the inspection floor 213, in a direction Df, which is a direction away from the vehicle 200 (this direction is the same direction as the front direction F) or in a direction Dn, which is a direction approaching the vehicle 200 (this direction is the same as the rear direction Rr), through the input/output I/F 26 and a sliding motor 210 (see FIG. 1).

In FIG. 1, when the emitted wave from the radar 206A and the LiDAR 208A of the electromagnetic wave sensor 201 has entered the target device 54, the target device 54 returns the reflection wave to the radar 206A and the LiDAR 208A.

In the present embodiment, the target device 54 is configured as a simulated vehicle that simulates the back side of an actual vehicle when viewed from the camera 204 (this simulated vehicle may have a flat plate shape). The target simulator 36 may cause the target device 54 to function as the preceding vehicle, an obstacle (falling object, person), or the like.

Figure 6:
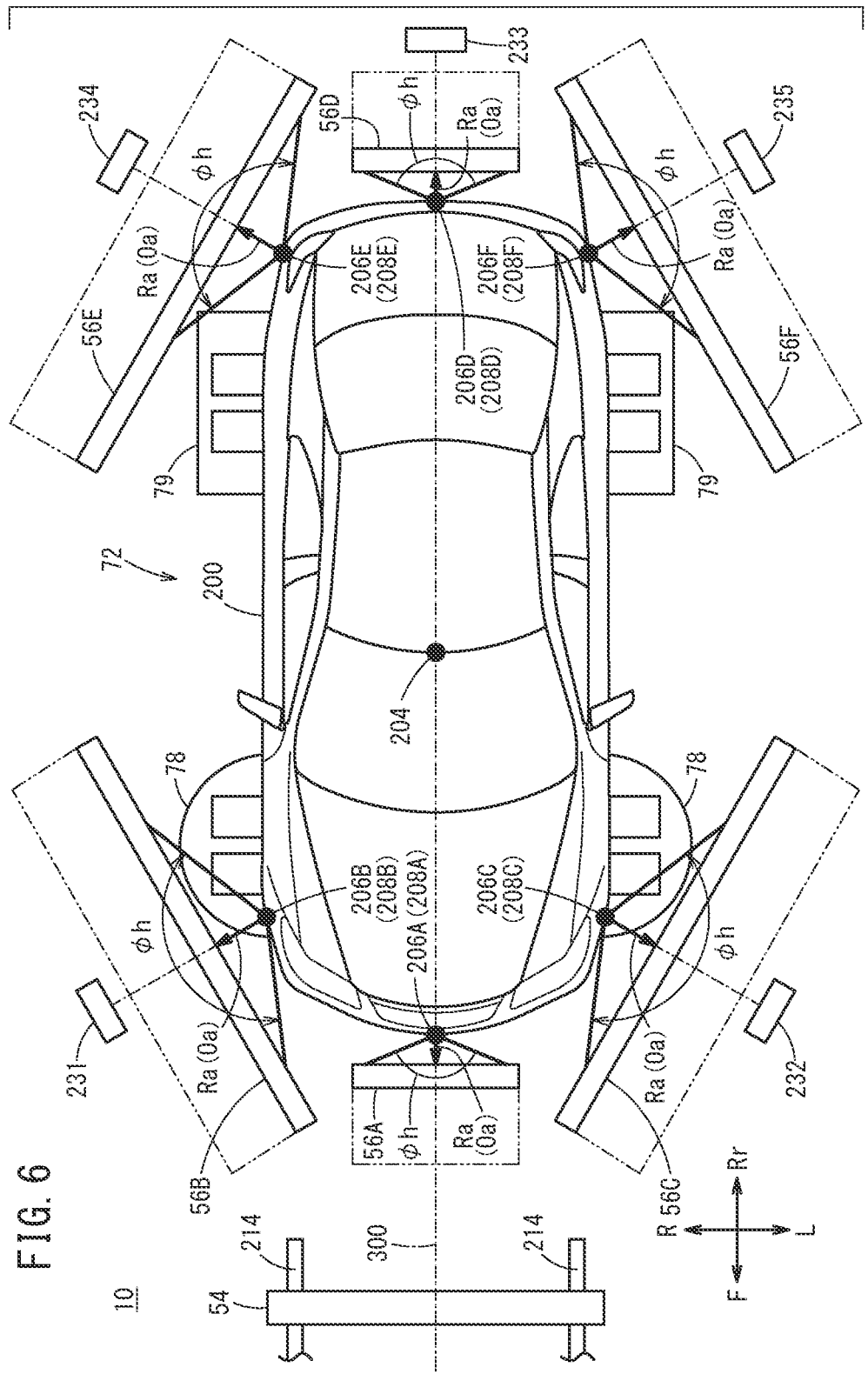
FIG. 6 is a partially omitted plan view of the vehicle inspection system in which the inspection vehicle is mounted on the bench test machine.

Through the input/output I/F 26 and rotation motors 212A, 212B, the electromagnetic wave absorbing simulator 38 raises the electromagnetic wave absorbers (electromagnetic wave blockers) 56A, 56D (see FIG. 4) in the up-down direction U, D so as to switch to an absorbing (blocking) position Pc where the electromagnetic wave (the electric wave from the radar 206 and the laser light from the LiDAR 208) is absorbed (blocked), or the electromagnetic wave absorbing simulator 38 lays down the electromagnetic wave absorbers 56A, 56D in the front-rear direction F, Rr along the inspection floor 213 (at a lying position that is illustrated by a two-dot chain line in FIGS. 3, 4, and 6) so as to switch to a passing position Pt (see FIG. 1) where the electromagnetic wave (electric wave and laser light) passes through.

As illustrated in FIG. 3, the electromagnetic wave absorber (electromagnetic wave blocker) 56A is disposed ahead of the vehicle 200 on the vehicle center line 300, and absorbs the electromagnetic wave from the radar 206A and the LiDAR 208A disposed at the front of the vehicle. The electromagnetic wave absorber (electromagnetic wave blocker) 56D is disposed behind the vehicle 200 on the vehicle center line 300, and absorbs the electromagnetic wave from the radar 206D and the LiDAR 208D disposed at the rear of the vehicle.

As described above, the wavelength of the electric wave of the radar 206 (206A to 206F) is several centimeters, for example, and the wavelength of the laser light of the LiDAR 208 (208A to 208F) is several micrometers. Thus, the wavelength ranges thereof are different from each other. Therefore, as it is commonly known, an absorbing material (absorber) that absorbs the electric wave and an absorbing material (absorber) that absorbs the laser light are different from each other. For example, the absorbing material for the radar results in the detection of the laser light from the LiDAR, and the absorbing material for the LiDAR results in the detection of the electric wave from the radar.

In this embodiment, both the electromagnetic waves (electric wave and laser light) are entirely absorbed in the electromagnetic wave absorbers 56 (56A to 56F) without reflection. To achieve this purpose, the electromagnetic wave absorbers 56 (56A to 56F) are disposed at positions in consideration of the arrangement positions of the radars 206 (206A to 206F) and the LiDARs 208 (208A to 208F) and have a characteristic structure, and this feature is described below with reference to FIG. 10A and FIG. 10B.

As illustrated in FIG. 3, the electromagnetic wave absorbers 56 include, in addition to the electromagnetic wave absorber 56A as described above, the electromagnetic wave absorber (electromagnetic wave blocker) 56B that absorbs the electromagnetic wave from the radar 206B and the LiDAR 208B on the right-front part of the vehicle, the electromagnetic wave absorber (electromagnetic wave blocker) 56C that absorbs the electromagnetic wave from the radar 206C and the LiDAR 208C on the left-front part of the vehicle, the electromagnetic wave absorber (electromagnetic wave blocker) 56D that absorbs the electromagnetic wave from the radar 206D and the LiDAR 208D on the rear part of the vehicle, the electromagnetic wave absorber (electromagnetic wave blocker) 56E that absorbs the electromagnetic wave from the radar 206E and the LiDAR 208E on the right-rear part of the vehicle, and the electromagnetic wave absorber (electromagnetic wave blocker) 56F that absorbs the electromagnetic wave from the radar 206F and the LiDAR 208F on the left-rear part of the vehicle so that each electromagnetic wave absorber is disposed in an emission direction corresponding to the front side of the electric wave axis of each radar 206 and the optical axis of each LiDAR 208.

When the electromagnetic wave absorbers 56 (56A to 56F) are at a standing position illustrated by a solid line in FIGS. 3 and 6, the electromagnetic wave absorber (electric wave absorber and laser light absorber to be described below) is disposed on a surface that faces the vehicle 200. When the electromagnetic wave absorbers 56 are at the lying position illustrated by a two-dot chain line in FIGS. 3 and 6, the electromagnetic wave absorber faces in the up-down direction U, D.

FIG. 6 is a partially omitted plan view of the vehicle inspection system 10, which shows substantially the same as FIG. 3 in order to avoid complicated lines in the drawing.

Figure 7:
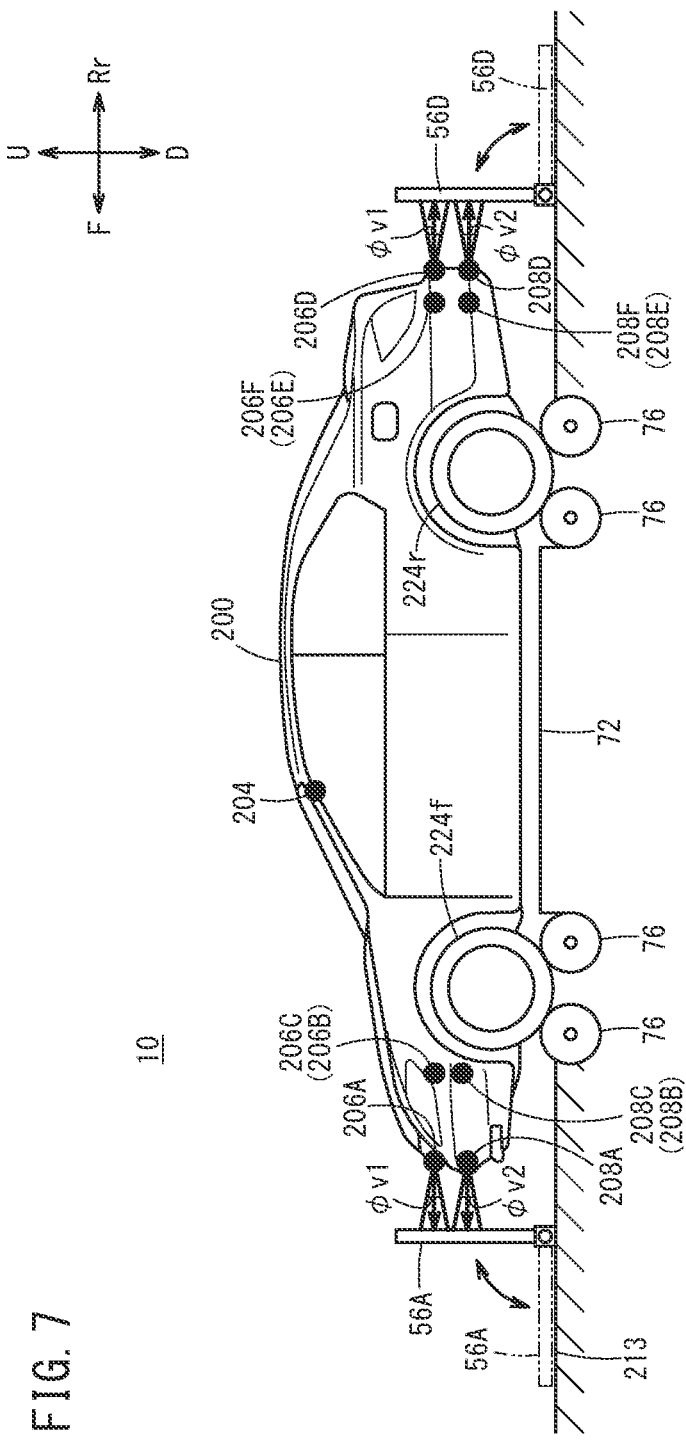
FIG. 7 is a partially omitted side view of the vehicle inspection system in which the inspection vehicle is mounted on the bench test machine.

FIG. 7 is a partially omitted side view of the vehicle inspection system 10, which shows substantially the same as FIG. 4 in order to avoid complicated lines in the drawing. As illustrated in FIG. 6, in the present embodiment, an irradiation range (emission angle) $\phi h$ of the radar 206 and the LiDAR 208 in the horizontal direction is set so that $\phi h=135°$ (±67.5° around each of electric wave axis Ra and optical axis Oa), for example. The irradiation ranges of the radar 206 and the LiDAR 208 in the horizontal direction overlap with each other at least partially. The irradiation ranges thereof need not necessarily overlap with each other entirely.

As illustrated in FIG. 6, each of the electromagnetic wave absorbers 56A to 56F is disposed and structured so as to cover the irradiation range (emission angle) $\phi h$ in the horizontal direction (so as to entirely absorb the electromagnetic wave in the irradiation range (emission angle) $\phi h$), and is also disposed and structured so as to cover emission angles $\phi v1$, $\phi v2$ in the vertical direction (so as to entirely absorb the emitted electromagnetic wave (emitted wave)).

Note that each of the electromagnetic wave absorbers 56E, 56F on the right-rear side and the left-rear side can be slid forward and outward with a standing state being maintained, so that the vehicle 200 can move forward or backward from the right side with respect to the bench test machine 72 in FIG. 6.

As illustrated in FIG. 4, the monitor 52 is configured so as to move upward and downward by the simulator device 20 or the inspection device 90 through an elevating mechanism (not shown) in an arrow direction that is parallel to the up-down direction U, D between a range that does not cover the view of the camera 204 (i.e., a position shown by two-dot chain line) and a range that covers the view (i.e., a position shown by solid line).

As illustrated in FIG. 6, the columnar target devices 54, 231 to 235 are disposed at the positions that are several meters (known distance in the simulator device 20 and the inspection device 90) away from the positions of the radars 206A to 206F and the LiDARs 208A to 208F in the direction toward which the electric wave axis Ra and the optical axis Oa are oriented, in order to inspect the function and performance of the electromagnetic wave sensors 201 including the radars 206A to 206F and the LiDARs 208A to 208F. Note that the columnar target devices 231 to 235 can be detected by the radars 206B to 206F and the LiDARs 208B to 208F at the lying positions of the electromagnetic wave absorbers 56B, 56C, 56D, 56E, 56F (see FIG. 6).

As illustrated in FIG. 5, the simulator device 20 includes the simulator storage device 24, and the simulator storage device 24 is formed by a hard disk, a ROM, a RAM, and the like. The simulator storage device 24 stores programs that are executed by the simulator calculation device 22, and the virtual external environment information 46 simulating the external environment information.

The virtual external environment information 46 is information to reproduce a series of virtual external environments, and the information about the initial position of the vehicle 200 in the virtual external environment, the position of each object (including the target device 54 and target devices 231 to 235) in the virtual external environment, the behavior of the moving object (including the target device 54), or the like is set in advance.

The input/output I/F 26 includes an A/D conversion circuit, a D/A conversion circuit, a communication I/F, a driver, and the like.

The monitor 52 displays the virtual information (video of external environment) corresponding to the virtual external environment reproduced by the simulator device 20, and the camera 204 detects (captures images of) the displayed information.

That is to say, as illustrated in FIG. 1, the monitor 52 is disposed to face a lens of the camera 204, and displays the video of the virtual external environment on the basis of the video information output from the camera simulator 34.

As illustrated in FIG. 1, the operation detection device 70 includes the bench test machine 72, receiving devices 74, a vehicle speed sensor 82, a vehicle position sensor 84, and a motor control device 88. The bench test machine 72 is installed on the inspection floor 213.

The receiving devices 74 are provided at positions of the wheels 224 (front wheels 224f, rear wheels 224r) of the vehicle 200 placed on the bench test machine 72, and serve as a mechanism to have the wheels 224 placed thereon and receive rotation operation of the wheels 224. A receiving device 74f provided on a location corresponding to the front wheels 224f, which serve as steerable wheels, includes two rollers 76, a supporting board 78, and a supporting board motor 80 in order to receive turning operation of the front wheels 224f, in addition to the rotation operation.

The two rollers 76 support the front wheels 224f from below and are rotatable around an axial line, which is parallel to a front-wheel axle, in accordance with the rotation of the front wheels 224f (rotation in forward direction or backward direction). The supporting board 78 supports the rollers 76 and is turnable in an arrow direction around an axial line, which is parallel to the up-down direction U, D of the vehicle 200. When the front wheels 224*f* are steered, in order to keep the orthogonal state between the front wheels 224*f* and the rollers 76, the supporting board 78 is driven, by the supporting board motor 80, to turn clockwise or counterclockwise by an amount corresponding to the steering angle θs.

Note that the steering angle θs of the front wheels 224*f* is detected by the vehicle position sensor 84 and supplied to the simulator device 20 as described below.

On the other hand, a supporting board 79 and two rollers 76 of a receiving device 74*r* provided on a location corresponding to rear wheels 224*r* support the rear wheels 224*r* from below and are rotatable around an axial line, which is parallel to a rear-wheel axle, in accordance with the rotation of the rear wheels 224*r* (rotation in forward direction or backward direction). In order to deal with the change of the vehicle type of the inspection vehicle 200 or the like, at least one of the receiving device 74*f* and the receiving device 74*r* is movable in the front-rear direction F, Rr in accordance with the wheel base of the inspection vehicle 200.

The vehicle speed sensor 82 is provided to the receiving device 74*f* on the side of the front wheels 224*f*, and is formed by, for example, a rotary encoder or a resolver. The vehicle speed sensor 82 detects rotation speed r of the roller 76. The rotation speed r corresponds to the vehicle speed V.

The vehicle position sensor 84 is provided on the side of the front wheels 224*f* serving as the steerable wheels, and is formed by a laser ranging device or the like. The vehicle position sensor 84 detects a displacement quantity dl from the initial position of the front wheels 224*f* caused by the steering. The displacement quantity dl is converted into the steering angle θs of the vehicle 200 by the vehicle position sensor 84 or the simulator calculation device 22. Note that the bench test machine 72 according to the embodiment is configured so as to inspect a front-wheel steering and front-wheel drive vehicle. However, for example, if the operation detection device 70 including the supporting board motor 80 and the like are also provided on a location corresponding to the rear wheels 224*r*, the bench test machine 72 can inspect, in addition to the front-wheel steering and front-wheel drive vehicle, a front-wheel steering and rear-wheel drive vehicle, a front-wheel steering and four-wheel drive vehicle, and the like.

The motor control device 88 is formed by a computer, and includes a calculation device, a storage device, and an input/output device. The calculation device controls the supporting board motor 80 provided to the receiving device 74*f* by executing programs stored in the storage device. Specifically, the calculation device calculates a turning angle θm of the receiving device 74*f* in accordance with the displacement quantity dl (steering angle θs) of the front wheels 224*f*. The input/output I/F 26 of the simulator device 20 supplies electric power to the supporting board motor 80 in order to rotate the receiving device 74*f* by the turning angle θm.

The operation detection device 70 outputs, to the simulator device 20, the operation information of the vehicle 200, that is, the rotation speed r (vehicle speed V) detected by the vehicle speed sensor 82 and the displacement quantity dl (steering angle θs) detected by the vehicle position sensor 84, and inputs this operation information into the simulator storage device 24 through the input/output I/F 26 (FIG. 5).

The inspection device 90 is formed so as to include a computer, and includes an inspection calculation device 92, an inspection storage device 94, an input/output I/F 95, and a communication I/F 96.

The inspection calculation device 92 achieves various functions by executing programs stored in the inspection storage device 94. For example, the inspection calculation device 92 acquires, through the simulator device 20, log data of the vehicle speed V and the steering angle θs detected by the operation detection device 70, and by comparing the acquired log data with model data stored in the inspection storage device 94, diagnoses abnormality in the vehicle 200.

Moreover, in the inspection device 90, the external environment information detected by the external environment sensors 202 is stored through the communication I/F 217 of the vehicle control device 216 and the communication I/F 96 of this inspection device 90.

[Operation]

The operation of the vehicle inspection system 10 according to the present embodiment that is basically configured as above will be explained with reference to a flowchart illustrated in FIG. 8.

In steps S1 to S6, the vehicle 200 is inspected on the bench test machine 72 in an idling state (stop state). In steps S7 to S12, the vehicle 200 is inspected on the bench test machine 72 in a constant speed state or accelerated/decelerated state (travel state).

In step S1, the vehicle 200 is moved to and mounted on the bench test machine 72 from behind the vehicle inspection system 10 by the driver operator who is sitting on the driver's seat. Then, the electromagnetic wave absorbers 56A, 56D are changed from the lying position to the standing position by an operation operator (inspection operator) who operates the inspection device 90 and the simulator device 20, and moreover, the electromagnetic wave absorbers 56B, 56C, 56E, 56F are changed from the lying position to the standing position. At this time, the wheels 224 are mounted on the respective receiving devices 74. In addition, the monitor 52 is set to a lowered position (see FIG. 1 and FIG. 4).

Next, the operation operator starts to reproduce the virtual external environment by operating the simulator device 20 with the inspection device 90. The simulator calculation device 22 reproduces the virtual external environment on the basis of the virtual external environment information 46 stored in the simulator storage device 24.

Figure 9A:
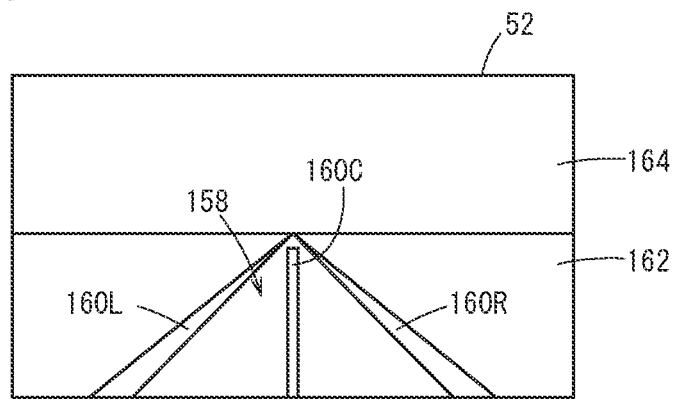
FIG. 9A is a screen diagram illustrating a video of a road in a grass field.

In this case, the camera simulator 34 generates, as the virtual information, a video signal indicating the video information illustrated in FIG. 9A, and supplies the video signal to the monitor 52 and to the inspection storage device 94 of the inspection device 90.

In step S2, the video based on the video signal is displayed on the monitor 52, that is, a sky 164, a road 158 in a grass field 162, and a left lane mark 160L, a center lane mark 160C, and a right lane mark 160R of the road 158 are displayed as a monitor screen.

FIG. 9A is a screen diagram illustrating the video of the road 158 in the grass field 162 that is photographed by the camera 204.

In this manner, it is assumed that the vehicle 200 in the idling state is positioned on the road 158 in the grass field 162 where neither targets nor obstacles exist around the vehicle 200.

In this case, that is, when the electromagnetic wave absorbers 56A to 56F are in the standing state (at standing position) and the monitor 52 is at the lowered position, the external environment information that is detected by the camera 204, the radars 206, and the LiDARs 208 (video information (video signal) from camera 204)) and object information from the radars 206 and the LiDARs 208 ((signal indicating reflection waves of electric wave and laser light (reflection wave signal))) are stored in the inspection storage device 94 through the communication I/F 217 of the vehicle control device 216 and the communication I/F 96 of the inspection device 90.

In step S3, the inspection calculation device 92 compares the video signal in the external environment information detected by the camera 204 and the video signal supplied from the camera simulator 34, whereby an initial inspection of the camera 204 is performed.

In step S4, it is inspected that the external environment information (object information: signal indicating reflection waves of electric wave and laser light (reflection wave signal)) that is detected by the radars 206 and the LiDARs 208 and stored in the inspection storage device 94 is an approximately zero value lower than a threshold (i.e., non-reflection is confirmed).

Figure 10A:
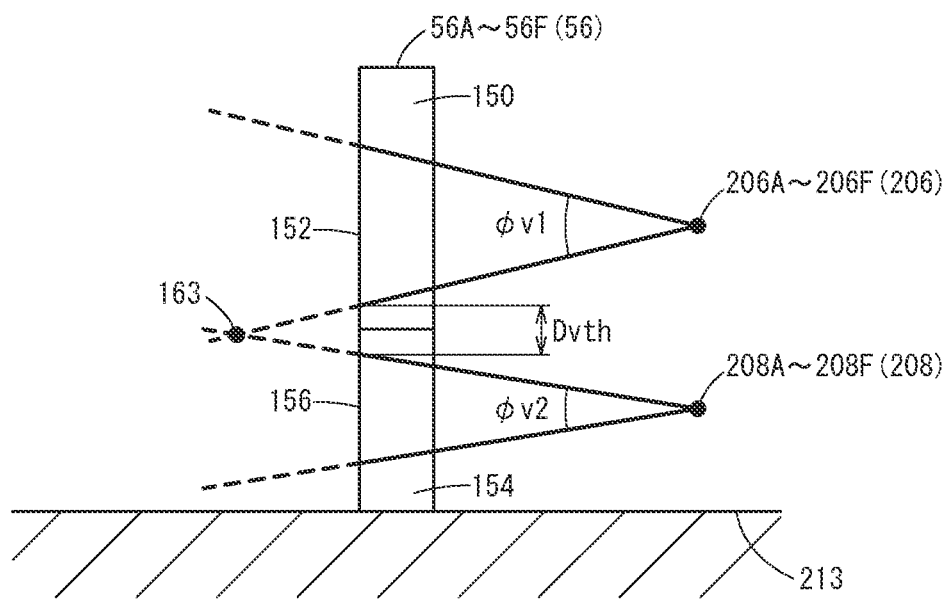
FIG. 10A is a schematic side view used for describing a state before irradiation ranges of an electric wave and laser light overlap with each other.

FIG. 10A is a schematic side view illustrating a state before the irradiation ranges of the electric wave and the laser light outputted (radiated) from the radar 206 (206A to 206F) and the LiDAR 208 (208A to 208F) overlap with each other ahead of the electromagnetic wave absorber 56 (56A to 56F) (the expression "ahead of" means "on a side closer to the radar 206 and the LiDAR 208) (i.e., a non-overlapping state).

Figure 10B:
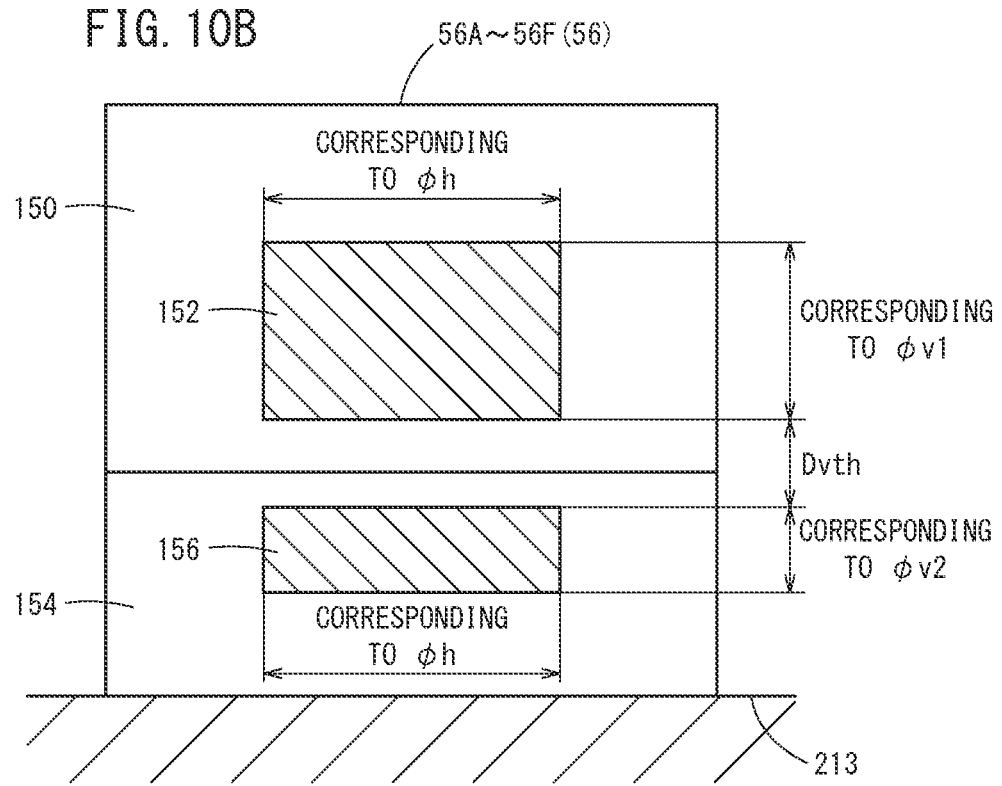

FIG. 10B is a schematic rear view in which FIG. 10A is viewed from the left.

As illustrated in FIG. 10A and FIG. 10B, the electromagnetic wave absorber 56 (56A to 56F) is integrally formed such that a first absorber (electric wave absorber) 150 that absorbs the emitted wave (having electric-wave wavelength range) from the radar 206A to 206F is disposed on the upper side in the up-down direction U, D, and a second absorber (laser light absorber) 154 that absorbs the emitted wave (having laser-light wavelength range) from the LiDAR 208A to 208F is disposed on the lower side in the up-down direction U, D.

An irradiation range 152 of the emitted wave (electric wave) from the radar 206A to 206F and an irradiation range 156 of the emitted wave (laser light) from the LiDAR 208A to 208F overlap with each other at a position 163. The first absorber 150 and the second absorber 154 are disposed at a position where the irradiation range 152 and the irradiation range 156 do not overlap with each other, i.e., disposed at a position short of the position 163.

Here, the position 163 where the irradiation range 152 of the emitted wave (electric wave) from the radar 206A to 206F and the irradiation range 156 of the emitted wave (laser light) from the LiDAR 208A to 208F overlap with each other corresponds to a position 163 where the lower part of the irradiated field having the emission angle $\phi v1$ of the radar 206A to 206F in the vertical direction and the upper part of the irradiated field having the emission angle $\phi v2$ of the LiDAR 208A to 208F in the vertical direction intersect each other behind the electromagnetic wave absorber 56A to 56F as illustrated in FIG. 10A.

In the irradiation range ahead of the inspection vehicle 200 and ahead of this intersection position 163, the irradiation range of the LiDAR 208A to 208F provided at the position corresponding to the radar 206A to 206F at least partially overlaps with the irradiation range of the radar 206A to 206F.

With this configuration, the emitted wave (electric wave) from the radar 206A to 206F and the emitted wave (laser light) from the LiDAR 208A to 208E can be reliably absorbed by the first absorber 150 and the second absorber 154. Thus, both the reflection waves can be approximately zero.

As illustrated in FIG. 10A and FIG. 10B, it is only necessary that the first absorber 150 and the second absorber 154 are disposed so as to be spaced from each other by such a distance (predetermined distance) Dvth (Dvth>0) that the irradiation range 152 of the emitted wave (electric wave) from the radar 206A to 206F and the irradiation range 156 of the emitted wave (laser light) from the LiDAR 208A to 208F do not overlap with each other in the up-down direction U, D (see FIG. 7). The distance Dvth may be determined in consideration of assembling tolerance or the like.

Figure 11:
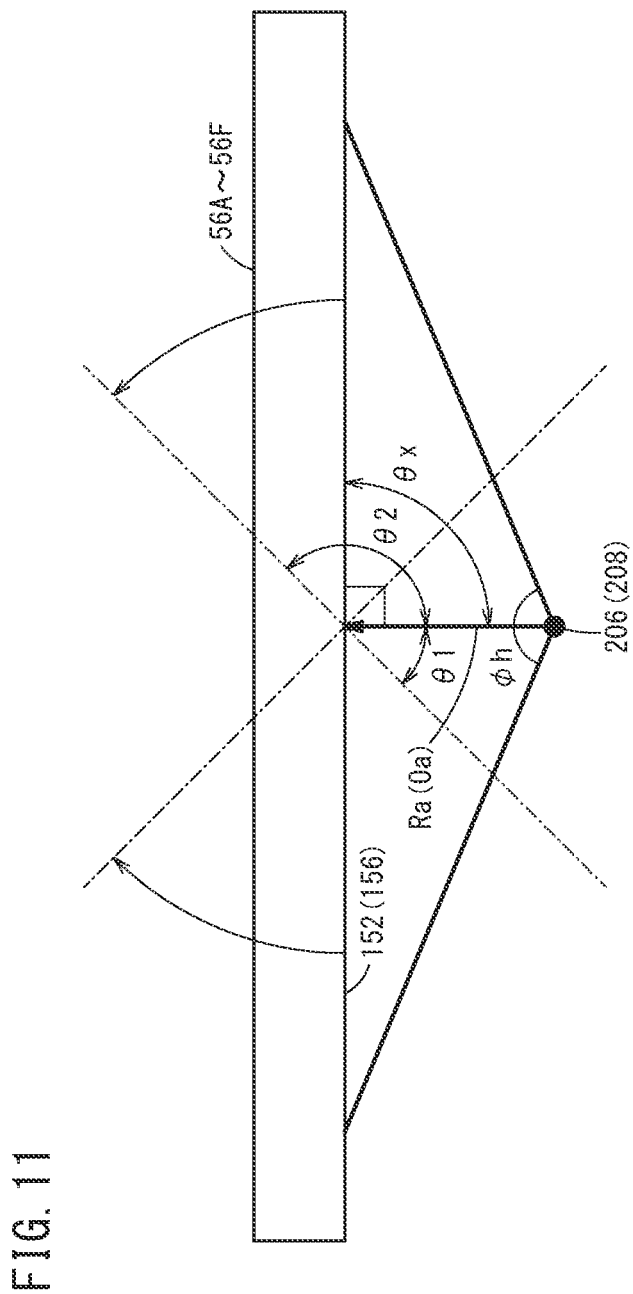
FIG. 11 is a schematic plan view used for describing an angle range where an absorbing function of an electromagnetic wave absorber is exhibited with respect to an electric wave axis (optical axis).

FIG. 11 is a schematic plan view illustrating an angle range where an absorbing function of the electromagnetic wave absorber 56A to 56F is exhibited with respect to the electric wave axis Ra (optical axis Oa).

As illustrated in FIG. 11, in relation to the irradiation range (emission angle) $\phi h$ in the horizontal direction, it is preferable that the angle $\theta x$ between the electric wave axis Ra of the radar 206 (the optical axis Oa of the LiDAR 208) and the electromagnetic wave absorber 56 (i.e., the angle between the traveling direction of the emitted wave and the electromagnetic wave absorber 56) satisfies $\theta x=90°$. That is to say, it is preferable that the electromagnetic wave absorber 56A to 56F is disposed so that the electric wave axis Ra (the optical axis Oa) and the electromagnetic wave absorber 56A to 56F are orthogonal to each other.

In this case, even if the electromagnetic wave absorber 56A to 56F is disposed at a position where the electromagnetic wave absorber 56A to 56F is rotated clockwise or counterclockwise to positions indicated by two-dot chain lines in FIG. 11 (90°±45°), i.e., the angle $\theta x$ between the electric wave axis Ra (the optical axis Oa) and the electromagnetic wave absorber 56 is set such that $\theta x=(\theta 1=45°$ to $\theta 2=135°)$, it has been confirmed that the electromagnetic wave absorber 56 can perform sufficient absorbing function in the actual inspection.

Thus, in order to improve the electromagnetic wave absorbing efficiency, it is more preferable that the electromagnetic wave absorbers 56A to 56F have, not a flat board shape, but a circular-arc shape, a C-letter shape, or an L-letter shape that is concave when viewed from the radar 206A to 206F and the LiDAR 208A to 208F so that a cross section of the electromagnetic wave absorber 56A to 56F in the horizontal direction (plan view) at the standing position is orthogonal to the wave surface of the electromagnetic wave (electric wave and laser light) as much as possible.

In step S4, since the electromagnetic wave absorbers 56 are disposed and configured (shaped) as described above, it is guaranteed that the external environment information (object information: signal indicating reflection waves of electric wave and laser light (reflection wave signal)) that is detected by the radars 206 and the LiDARs 208 and stored in the inspection storage device 94 has approximately zero value, which is lower than the threshold.

That is to say, the vehicle inspection system 10 is configured to be able to simulate that the vehicle 200 travels on the road 158 in the grass field 162 corresponding to the external environment without obstacles around the vehicle 200, by the arrangement of the electromagnetic wave absorbers 56.

In this manner, in step S4, the electromagnetic wave sensor (radar 206 and LiDAR 208) is inspected by the inspection device 90.

In step S5, all the electromagnetic wave absorbers 56A to 56F are laid down.

In addition, the target device 54 disposed ahead of the vehicle is moved by a known distance in the direction Df away from the vehicle 200, or the direction Dn approaching the vehicle 200, along the rail 214 on the inspection floor 213.

In step S6, the radar 206A and the LiDAR 208A provided on the front part of the vehicle 200 detect the target device 54 (FIG. 1, FIG. 6), as illustrated in FIG. 6, the radar 206B and the LiDAR 208B provided on the right-front part of the vehicle detect the target device 231, the radar 206C and the LiDAR 208C provided on the left-front part of the vehicle detect the target device 232, the radar 206E and the LiDAR 208E provided on the right-rear part of the vehicle detect the target device 234, the radar 206F and the LiDAR 208F provided on the left-rear part of the vehicle detect the target device 235, and the radar 206D and the LiDAR 208D provided on the rear part of the vehicle detect the target device 233.

At this time, the inspection calculation device 92 compares the known distances (supplied from the simulator device 20) from the radars 206A to 206F and the LiDARs 208A to 208F to the target devices 54, 231 to 235 and the measured distances converted from reflection signals detected by the radars 206A to 206F and the LiDARs 208A to 208F (acquired through the communication I/F 217 and the communication I/F 96), whereby the radars 206A to 206F and the LiDARs 208A to 208F are inspected (i.e., operation thereof is checked).

In this manner, in step S6, the electromagnetic wave sensors (radars 206 and LiDARs 208) are inspected by the inspection device 90.

In step S7, all the electromagnetic wave absorbers 56A to 56F are placed into a standing state.

Then, the travel on the road 158 in the grass field 162 illustrated in FIG. 9A is simulated.

At this time, the driver operator steps on the accelerator pedal until the vehicle speed becomes a predetermined vehicle speed (designated vehicle speed) designated (displayed) on the monitor 52, and turns on a switch for an inter-vehicle distance maintenance function, so that the vehicle 200 is placed in a travel state of traveling at the predetermined vehicle speed (designated vehicle speed) on the bench test machine 72. Note that the vehicle speed V is detected by the vehicle speed sensor 82 and displayed on the monitor 52, and thus, the driver operator can easily set the vehicle 200 in the travel state of traveling at the predetermined vehicle speed (designated vehicle speed) (i.e., in a state that the front wheels 224f are rotating).

In this case, the camera simulator 34 detects the steering angle θs based on the displacement quantity (positional shift) dl detected by the vehicle position sensor 84 and the vehicle speed V detected by the vehicle speed sensor 82, sequentially generates the video information around the vehicle 200 corresponding to the detected vehicle speed V and steering angle θs, and outputs the generated video information to the monitor 52. For example, if the driver operator operates a steering to the left, the camera simulator 34 generates the video information where the left lane mark 160L gets closer to the center of the screen.

In this manner, in step S7, the driver operator operates the driving device 218 and the steering device 220, and thus the operation of the camera 204 is checked (inspected) by the inspection device 90.

In the step S8, the driver operator turns on a switch for a lane keeping function.

At this time, if the driver operator operates the steering to the left, the camera simulator 34 generates the video information where the left lane mark 160L gets closer to the center of the screen.

In this case, on the basis of the video signal (video information) from the camera 204, the vehicle control device 216 recognizes that the vehicle 200 is not in a state where the vehicle 200 travels at the center between the two lane marks (the left lane mark 160L and the center lane mark 160C).

Then, the vehicle control device 216 performs automated steering control for the steering of the inspection vehicle 200 through the steering device 220 so that the vehicle 200 travels at the center between the two lane marks (the left lane mark 160L and the center lane mark 160C).

The displacement quantity (positional shift) dl of the front wheels 224f in the automated steering control is detected by the vehicle position sensor 84, and thus the video information to be displayed on the monitor 52 is continuously updated.

A series of pieces of relevant information is continuously logged in the inspection device 90, and the lane keeping function of the vehicle 200 is inspected.

In this manner, in step S8, the driver operator operates the driving device 218, whereby the automated steering function for the steering device 220 is performed by the vehicle control device 216 and the camera 204 is inspected by the inspection device 90.

In step S9, only the electromagnetic wave absorber 56A is placed in a lying position. Note that if it is necessary to detect the target device 54 also by the electric waves from the right-front radar 206B and the left-front radar 206C, the front end portions (front direction F side) of the electromagnetic wave absorber 56B and the electromagnetic wave absorber 56C may be placed into the lying positions as indicated by two-dot chain lines or rotated respectively outer-rightward and outer-leftward so as not to allow the electromagnetic wave absorber 56B and the electromagnetic wave absorber 56C to absorb the electric waves.

In step S10, the camera simulator 34 generates the video information of the preceding vehicle that is traveling on a region between the lane mark 160L and the lane mark 160C at the same speed as the vehicle 200, and causes the monitor 52 to display the generated video information.

Figure 9B:
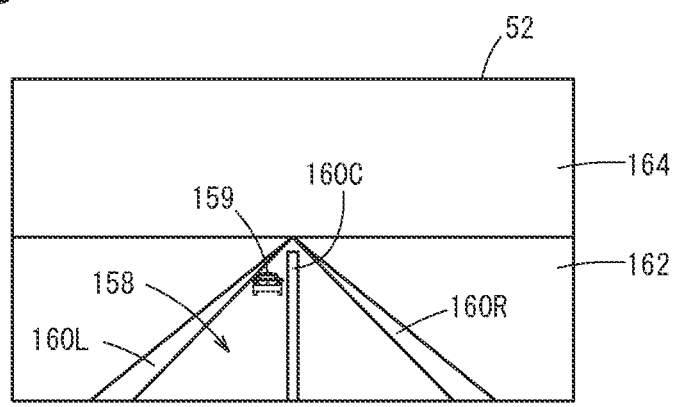
FIG. 9B is a screen diagram illustrating a video in which a preceding vehicle is traveling on the road.

FIG. 9B is a screen diagram illustrating a video in which a preceding vehicle 159 is traveling on the road 158. As illustrated in FIG. 9B, the monitor 52 displays the preceding vehicle 159 that is traveling on the road 158. In this case, the camera simulator 34 generates the video information so that the distance (position) of the preceding vehicle 159 on the road 158 in a depth direction is displayed as a distance (position) corresponding to a distance to the target device 54 detected by the radar 206A and the LiDAR 208A, and causes the monitor 52 to display the generated video information.

In this manner, in step S10, the driver operator operates the driving device 218 to thereby cause the inspection device 90 to inspect the electromagnetic wave sensor (radar 206A and LiDAR 208A) and the camera 204.

In step S11, in this state, the driver operator turns on the switch for the inter-vehicle distance maintenance function.

At that time, in the vehicle 200, an inter-vehicle maintained distance to the preceding vehicle 159 is automatically set to a distance from the vehicle 200 to the current target device 54.

In a state where the inter-vehicle distance to the preceding vehicle 159 (target device 54) is automatically set, the target simulator 36 moves the target device 54 that is disposed ahead of the vehicle on the inspection floor 213, in the direction Df away from the vehicle 200, or in the direction Dn approaching the vehicle 200, along the rail 214 (see FIG. 1).

In this case, the vehicle control device 216 automatically drives (accelerates or decelerates) the driving device 218 such that the distance detected by the radar 206A and the LiDAR 208A is the distance that is automatically set. Thus, the inter-vehicle distance maintenance function is operated.

In this case also, a series of pieces of relevant information is continuously logged in the inspection device 90, so that the inter-vehicle maintenance function of the vehicle 200 is inspected.

In step S11, the automated driving control of the driving device 218 by the vehicle control device 216, the electromagnetic wave sensor 201 (radar 206A and LiDAR 208A), and the camera 204 are inspected by the inspection device 90.

In step S12, the target simulator 36 moves the target device 54 that is disposed ahead of the vehicle on the inspection floor 213, in the direction Dn further approaching the vehicle 200, along the rail 214.

The movement of the target device 54 is generated as the video information by the camera simulator 34, and displayed on the monitor 52 as change of the preceding vehicle 159 in the depth direction.

Figure 9C:
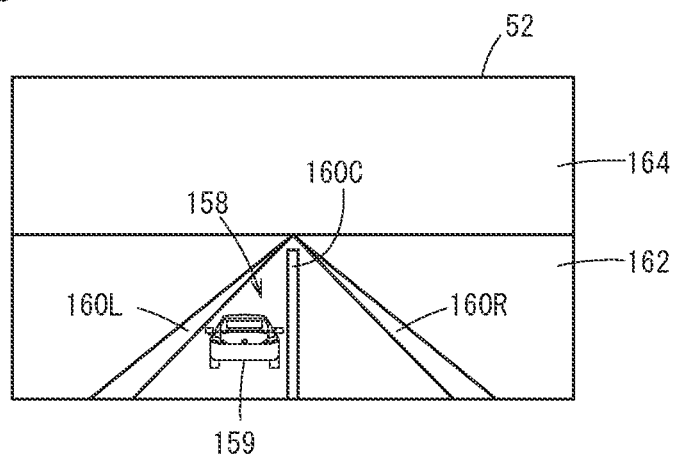
FIG. 9C is a screen diagram illustrating a video in which the preceding vehicle is quickly approaching the inspection vehicle.

FIG. 9C is a screen diagram illustrating the video in which the preceding vehicle 159 rapidly comes close to (is rapidly approaching) the inspection vehicle 200 equipped with the camera 204.

In this case, if the target device 54 is approaching the vehicle 200 rapidly to such a degree that the inter-vehicle distance maintenance function set by the inter-vehicle distance maintenance function by the radar 206A, the LiDAR 208A, and the driving device 218 cannot be performed, the vehicle control device 216 determines that the vehicle 200 is in a state where the vehicle 200 may collide with the preceding vehicle 159 on the monitor 52 that is simulated by the target device 54, and then the vehicle control device 216 compulsorily operates the braking device 222 to thereby operate an automated brake function so as to stop the vehicle 200.

In this case as well, a series of pieces of relevant information is continuously logged in the inspection device 90, so that the automated brake function of the vehicle 200 is inspected.

In step S12, the automated brake control of the braking device 222 by the vehicle control device 216, the electromagnetic wave sensor 201 (radar 206A and LiDAR 208A), and the camera 204 are inspected by the inspection device 90.

After the inspection steps S1 to S12 for a series of functions up to the automated brake function inspection have been completed, the vehicle 200 exits from the bench test machine 72, the next vehicle 200 is mounted on the bench test machine 72, and a series of function inspections of steps S1 to S12 is restarted. [Invention obtained from embodiment] Here, the invention that is obtained from the above embodiment is hereinafter described. Note that to help understanding, the components are denoted with the symbols used in the above embodiment; however, the components are not limited to those denoted with the symbols.

The vehicle inspection system 10 according to the present invention is configured to inspect, on the bench test machine 72, the inspection vehicle 200 including the electromagnetic wave sensor 201 configured to emit the electromagnetic wave and detect the external environment information by the reflection wave, the camera 204 configured to detect the external environment information by the image, and the vehicle control device 216 configured to operate the actuator 218, 220, 222 for the steering, the driving, or the braking on the basis of both the detected external environment information, the vehicle inspection system 10 including: the monitor 52 configured to display the simulation image simulating the external environment information by the image, the simulation image being photographed by the camera 204; the target device 54 configured to return the reflection wave upon the incidence of the emitted wave from the electromagnetic wave sensor 201; the simulator device 20 configured to change the external environment information by changing at least one of the simulation image to be displayed on the monitor 52 and the reflection wave to be returned from the target device 54; and the inspection device 90 configured to inspect the operation of the actuator 218, 220, 222 of the inspection vehicle 200 on the basis of the changed external environment information.

With this configuration, the vehicle inspection system includes: the monitor 52 configured to display the simulation image simulating the external environment information by the image, photographed by the camera 204; the target device 54 configured to return the reflection wave upon the incidence of the emitted wave from the electromagnetic wave sensor 201; the simulator device 20 configured to change the external environment information by changing at least one of the simulation image to be displayed on the monitor 52 and the reflection wave to be returned from the target device 54; and the inspection device 90 configured to inspect the operation of the actuator 218, 220, 222 of the inspection vehicle 200 on the basis of the changed external environment information.

Therefore, the inconsistency between the external environment information detected by the electromagnetic wave sensor 201 and the external environment information detected by the camera 204 is resolved, and it is possible to inspect the operation of the actuator 218, 220, 222 for the steering, the driving, or the braking of the inspection vehicle 200 including the electromagnetic wave sensor 201 and the camera 204.

Moreover, the vehicle inspection system 10 may further include the electromagnetic wave absorber 56A to 56F configured to absorb the emitted wave that is emitted from the electromagnetic wave sensor 201 to the target device 54, 231 to 235, wherein: the simulator device 20 may cause the monitor 52 to display the simulation image simulating the road 158 including the lane mark 160L, 160C, 160R; and the inspection device 90 may inspect the operation of the actuator 220 for the steering of the inspection vehicle 200, on the basis of the simulation image simulating the road 158 including the lane mark 160L, 160C, 160R, the simulation image being photographed by the camera 204.

In this manner, the simulator device 20 generates the simulation image representing the road 158 including the lane mark 160L, 160C, 160R and causes the monitor 52 to display the generated simulated image, in the state where the electromagnetic wave absorber 56A to 56F does not allow the reflection wave by the electromagnetic wave sensor 201 to be generated. Therefore, the inconsistency between the external environment information detected by the electromagnetic wave sensor 201 and the external environment information detected by the camera 204 is resolved, and it is possible to inspect, with a simple configuration, the operation of the actuator 220 for the steering in a situation that the inspection vehicle 200 performs simulated traveling so as to keep traveling at the center, for example, between the lane marks 160L, 160C.

Furthermore, in the vehicle inspection system 10, the simulator device 20 may cause the monitor 52 to display the simulation image in which the preceding vehicle 159 exists at a position that is the predetermined distance ahead of the inspection vehicle 200, the target device 54 may be disposed at the position so as to return the reflection wave from the position that is the predetermined distance ahead of the inspection vehicle 200, to thereby cause the target device 54 to operate as the simulated vehicle of the preceding vehicle 159 on the simulation image, and when both the positions of the preceding vehicle 159 in the simulation image photographed by the camera 204 and the simulated vehicle corresponding to the target device 54 are synchronously changed in time and in distance in the direction Df, Dn where the target device 54 is moved away from or close to the inspection vehicle 200 from the position that is the predetermined distance ahead of the inspection vehicle 200, the inspection device 90 may inspect whether the inspection vehicle 200 follows up the target device 54 so as to keep the predetermined distance by the actuator 218 for the driving.

In this manner, when the positions of the preceding vehicle 159 in the simulation image by the simulator device 20 and the target device 54 as the simulated vehicle are synchronously changed in time and in distance in the direction Df where the target device 54 is moved away from the inspection vehicle 200 or the direction Dn where the target device 54 approaches the inspection vehicle 200, with the position that is the predetermined distance ahead of the inspection vehicle 200 as a starting point, it is inspected whether the inspection vehicle 200 follows up the target device 54 so as to keep the predetermined distance. Thus, the operation of the actuator 218 regarding the driving can be inspected with a simple configuration.

In addition, in the vehicle inspection system 10, the simulator device 20 may cause the monitor 52 to display the simulation image in which the obstacle 159 exists at a position that is the predetermined distance ahead of the inspection vehicle 200, the target device 54 may be disposed, as the simulated obstacle of the obstacle 159, at the position corresponding to the position that is the predetermined distance ahead of the inspection vehicle 200, wherein the obstacle 159 returns the reflection wave at the position that is the predetermined distance ahead of the inspection vehicle, and in the case where the positions of the obstacle 159 in the simulation image photographed by the camera 204 and the target device 54 that is operated as the simulated obstacle are synchronously changed in time and in distance in the direction Dn where the target device 54 approaches the inspection vehicle 200 from the position that is the predetermined distance ahead of the inspection vehicle 200, when the inspection vehicle 200 is in the state where the inspection vehicle 200 may collide with the target device 54 serving as the simulated obstacle, the inspection device 90 may inspect whether the inspection vehicle 200 operates the actuator 222 for the braking so as to stop the inspection vehicle 200.

In this manner, in the case where the positions of the obstacle (preceding vehicle 159 or another object) in the simulation image by the simulator device 20 and the simulated obstacle corresponding to the target device 54 are synchronously changed in time and in distance in the direction Dn where the target device 54 approaches the inspection vehicle 200 from the position that is the predetermined distance ahead of the inspection vehicle 200, when the inspection vehicle 200 is in the state where the inspection vehicle 200 may collide with the simulated obstacle corresponding to the target device 54, it is inspected whether the inspection vehicle 200 operates so as to stop by the actuator 222 regarding the braking of the inspection vehicle 200. Thus, the actuator 222 regarding the braking can be inspected with a simple configuration.

Note that the present invention is not limited to the above embodiment, and can employ various configurations on the basis of the description of the specification; for example, the image may be projected in a display area by a projector, instead of the monitor 52.

What is claim is:

1. A vehicle inspection system configured to inspect, on a bench test machine, an inspection vehicle including an electromagnetic wave sensor configured to emit an electromagnetic wave and detect external environment information by a reflection wave, a camera configured to detect external environment information by an image, and a vehicle control device configured to operate an actuator regarding steering, driving, or braking on a basis of both the detected external environment information, the vehicle inspection system comprising:

a monitor configured to display a simulation image simulating the external environment information by the image, the simulation image being photographed by the camera;

a target device configured to return the reflection wave upon incidence of an emitted wave from the electromagnetic wave sensor;

a simulator device configured to change the external environment information by changing at least one of the simulation image to be displayed on the monitor and the reflection wave to be returned from the target device;

an inspection device configured to inspect operation of the actuator of the inspection vehicle on a basis of the changed external environment information, and an electromagnetic wave absorber configured to absorb the emitted wave that is emitted from the electromagnetic wave sensor to the target device, wherein:

the simulator device is configured to cause the monitor to display the simulation image simulating a road including a lane mark; and the inspection device is configured to inspect operation of the actuator regarding the steering of the inspection vehicle, based on the simulation image simulating the road including the lane mark, the simulation image being photographed by the camera.

2. The vehicle inspection system according to claim 1, wherein:

the simulator device is configured to cause the monitor to display the simulation image in which a preceding vehicle exists at a position that is a predetermined distance ahead of the inspection vehicle;

the target device is disposed at a position so as to return the reflection wave from the position that is the predetermined distance ahead of the inspection vehicle, to thereby cause the target device to operate as a simulated vehicle of the preceding vehicle on the simulation image; and when both positions of the preceding vehicle in the simulation image photographed by the camera and the simulated vehicle corresponding to the target device are synchronously changed in time and in distance in a direction where the target device is moved away from or close to the inspection vehicle from the position that is the predetermined distance ahead of the inspection vehicle, the inspection device is configured to inspect whether the inspection vehicle follows up the target device so as to keep the predetermined distance by the actuator regarding the driving.

3. The vehicle inspection system according to claim 1, wherein:

the simulator device is configured to cause the monitor to display the simulation image in which an obstacle exists at a position that is a predetermined distance ahead of the inspection vehicle;

the target device is disposed, as a simulated obstacle of the obstacle, at a position corresponding to the position that is the predetermined distance ahead of the inspection vehicle, so that the obstacle returns the reflection wave at the position that is the predetermined distance ahead of the inspection vehicle; and in a case where positions of the obstacle in the simulation image photographed by the camera and the target device that is operated as the simulated obstacle are synchronously changed in time and in distance in a direction where the target device approaches the inspection vehicle from the position that is the predetermined distance ahead of the inspection vehicle, when the inspection vehicle is in a state where the inspection vehicle may collide with the target device serving as the simulated obstacle, the inspection device is configured to inspect whether the inspection vehicle operates the actuator regarding the braking so as to stop the inspection vehicle.

* * * * *